(12) United States Patent
Kaper et al.

(10) Patent No.: US 10,014,433 B2
(45) Date of Patent: Jul. 3, 2018

(54) DEVICE FOR HEATING A SUBSTRATE

(71) Applicant: SMIT OVENS B.V., Son (NL)

(72) Inventors: Gerard Kaper, Waalre (NL); Wiro Rudolf Zijlmans, Son (NL)

(73) Assignee: SMIT THERMAL SOLUTIONS B.V., Son (NL)

(*) Notice: Subject to any disclaimer, the term of this patent is extended or adjusted under 35 U.S.C. 154(b) by 385 days.

(21) Appl. No.: 14/354,730

(22) PCT Filed: Oct. 25, 2012

(86) PCT No.: PCT/NL2012/050745
§ 371 (c)(1),
(2) Date: Apr. 28, 2014

(87) PCT Pub. No.: WO2013/062414
PCT Pub. Date: May 2, 2013

(65) Prior Publication Data
US 2014/0287373 A1    Sep. 25, 2014

(30) Foreign Application Priority Data

Oct. 26, 2011  (NL) ..................................... 2007658

(51) Int. Cl.
*H01L 31/18*  (2006.01)
*H01L 21/677*  (2006.01)
(Continued)

(52) U.S. Cl.
CPC .... *H01L 31/1872* (2013.01); *H01L 21/02568* (2013.01); *H01L 21/02667* (2013.01);
(Continued)

(58) Field of Classification Search
CPC ........... H01L 21/67706; H01L 31/1876; H01L 21/67745; H01L 21/1872; F16C 13/026; F27B 7/24; F27B 9/2407; F23G 2203/212
(Continued)

(56) References Cited

U.S. PATENT DOCUMENTS 2,863,680 A    12/1958  Taltavall
3,268,232 A *   8/1966  Richards ............... F16J 15/3448
                                                              277/398
(Continued)

FOREIGN PATENT DOCUMENTS

DE    102009037299 A1 *  8/2011  ......... C03B 27/0404
EP       0 908 928 A2       4/1999
(Continued)

OTHER PUBLICATIONS

International Search Report, dated Dec. 6, 2012, from corresponding PCT application.

*Primary Examiner* — Steven B McAllister
*Assistant Examiner* — Steven Anderson, II
(74) *Attorney, Agent, or Firm* — Young & Thompson

(57) ABSTRACT

A device for heating a substrate according to a predetermined temperature profile for crystallizing a material on the substrate includes: a housing, at least a process chamber situated inside the housing and provided with a first and second opening for passing through a substrate, an inlet for introducing a process gas which includes the material in vapor phase into the chamber, at least two transport rollers attached to the housing for transporting the substrate into the chamber. The device further includes passage spaces for preventing the escape of process gas from the chamber to a space between the chamber and housing, which are situated near respective ends of the transport rollers in the chamber, the respective passage spaces having a first passage opening on an inner wall of the chamber, a second passage opening (Continued)

on an outer wall of the chamber and a first flange fixed around the transport roller.

15 Claims, 4 Drawing Sheets

(51) Int. Cl.
    *H01L 21/67*     (2006.01)
    *H01L 21/06*     (2006.01)
    *H01L 21/02*     (2006.01)

(52) U.S. Cl.
    CPC ........ *H01L 21/06* (2013.01); *H01L 21/67017* (2013.01); *H01L 21/67109* (2013.01); *H01L 21/67173* (2013.01); *H01L 21/67706* (2013.01); *H01L 21/67745* (2013.01); *H01L 31/1876* (2013.01); *Y02E 10/50* (2013.01); *Y02P 70/521* (2015.11)

(58) Field of Classification Search
    USPC .................................................. 432/115, 41
    See application file for complete search history.

(56) References Cited

U.S. PATENT DOCUMENTS

| | | | | |
|---|---|---|---|---|
| 3,988,026 A | * | 10/1976 | Kemp, Jr. | ............ F16J 15/3472 277/369 |
| 4,193,756 A | * | 3/1980 | Leon | ......................... F27B 7/24 277/389 |
| 4,330,268 A | * | 5/1982 | Kremheller | ........... F27B 9/2407 198/791 |
| 4,809,992 A | | 3/1989 | Kemp, Jr. et al. | |
| 5,468,002 A | * | 11/1995 | Wasser | ................. F16J 15/3404 277/361 |
| 5,551,670 A | * | 9/1996 | Heath | ...................... C21D 1/34 266/103 |
| 5,578,503 A | | 11/1996 | Karg et al. | |
| 5,957,261 A | * | 9/1999 | Inoue | ..................... B65G 39/02 193/37 |
| 6,139,712 A | * | 10/2000 | Patton | ...................... C25D 7/12 205/137 |
| 2010/0086002 A1 | * | 4/2010 | Hwang | .................... C21D 1/42 373/7 |
| 2012/0171632 A1 | | 7/2012 | Novak et al. | |

FOREIGN PATENT DOCUMENTS

| | | | | |
|---|---|---|---|---|
| GB | 1513547 A | * | 6/1978 | ............ F16L 59/184 |
| GB | 1 558 425 A | | 1/1980 | |
| JP | 2003 209064 A | | 7/2003 | |
| WO | 2009/130790 A1 | | 10/2009 | |
| WO | WO2009/130790 | * | 10/2009 | |
| WO | 2011/018226 A1 | | 2/2011 | |

* cited by examiner

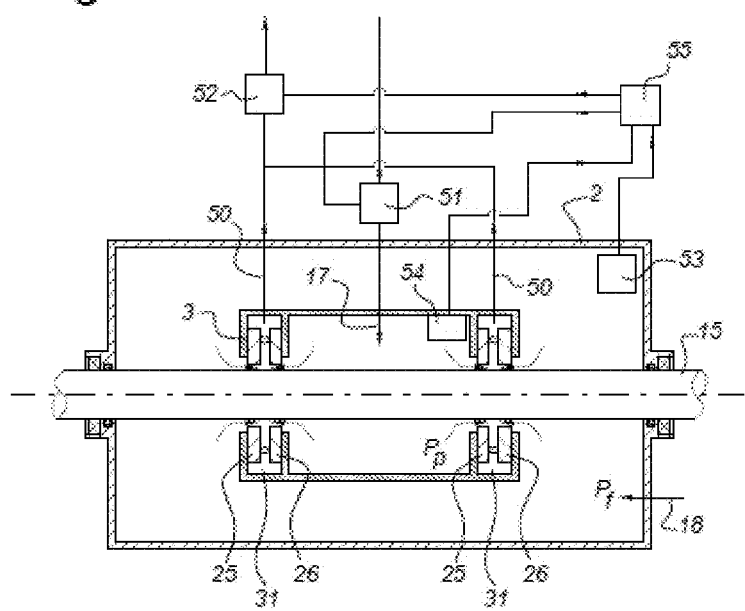

DEVICE FOR HEATING A SUBSTRATE

BACKGROUND OF THE INVENTION

Field of the Invention

The invention relates to a device for heating a substrate according to a predetermined temperature profile for crystallizing a material on the substrate.

Description of the Related Art

Such a device is known from U.S. Pat. No. 5,578,503 and is also referred to as a Rapid Thermal Processor (RTP).

The known device is used to successively heat and cool a substrate according to a specific temperature profile, for example for crystallizing a material on the substrate. A previously applied selenium layer is used, inter alia, to produce a light-absorbing film layer which comprises copper (Cu), indium (I), gallium (Ga) and/or selenium (Se) which is used, for example, to improve photo-electric efficiency of solar cells. The known device can be used to crystallize this base material which comprises, for example, copper, indium, gallium and/or selenium, in a controlled atmosphere of a process gas which comprises, for example, a metal vapour.

The known device may comprise several process chambers, each of which is subjected to a specific temperature profile by heating these process chambers by means of heating elements.

The known device may also be provided with a gas inlet for allowing purge gas to flow into the housing, for example nitrogen ($N_2$) for producing a low-oxygen environment. In a subsequent process chamber, a different temperature may be set in accordance with the temperature profile to be followed which is desired to carry out recrystallization. Furthermore, the process chambers contain a controlled atmosphere, for example containing a process gas which comprises, for example, selenium vapour, so that the recrystallization takes place at a certain phase transition. The known device is furthermore provided with transporting means for transporting the substrate into and out of the process chamber via the first and the second opening, respectively. These transporting means may comprise a box which contains the substrate. In this box, a certain environment of the substrate, for example selenium vapour, can be maintained at a certain pressure or vapour pressure in a simple manner. A problem of the known device is controlling the environment of the substrate in the process chamber.

BRIEF SUMMARY OF THE INVENTION

It is an object of the invention to provide a device in which improved crystallization of the material can take place.

According to a first aspect of the invention, this object is achieved by a device for heating a substrate according to a predetermined temperature profile for crystallizing a material on the substrate, comprising a housing, at least a first process chamber which is situated inside the housing and which is provided with a first and second sealable opening for passing through a substrate, an inlet for introducing a process gas into the first process chamber, at least two transport rollers for transporting the substrate into the first process chamber, which transport rollers are attached to the housing so as to be rotatable, sealing means to prevent the escape of the process gas from the process chamber to a space between the process chamber and the housing wherein the sealing means comprise passage spaces which are situated near respective ends of the transport rollers in the process chamber, wherein the respective passage spaces are provided with a first passage opening on an inner wall of the process chamber, a second passage opening on an outer wall of the process chamber and a first flange which is fixed around the transport roller. The sealing means prevent the escape of process gas from the process chamber to the space between the housing and the process chamber. This process gas may escape via the passage of the transport rollers in the process chamber. By preventing losses, the conditions of the process gas, for example the vapour phase, in the environment of the substrate can be controlled more accurately, resulting in improved recrystallization. In addition, contamination of the purge gas by the process gas is prevented. By using these sealing means, it furthermore becomes possible to place the substrate directly on the transport rollers. As a box is no longer present, the substrate is better able to follow the desired temperature profile, since no thermal capacity of the box is present, thus further improving the conditions for the recrystallization of the material.

By providing the flange in the passage space, in which case, for example, the flange is pressed in the axial direction against one or both inner walls, the escape of process gas via the passage to the space between the process chamber and the housing can be prevented further. A further advantage of this construction is the fact that the flange sealing can slide along the transport axle in the axial direction and can move with respect to the wall of the process chamber in the radial direction, making it possible to compensate for dimensional changes in the dimensions and position of transport rollers caused by various thermal expansions.

In a further embodiment of the device, the respective passage spaces comprise a second flange which is fixed around the transport roller next to the first flange, wherein the first flange is situated near the first passage opening and the second flange is situated near the second passage opening. By using a second flange, the sides of the flanges can be adjusted independently from each other with respect to the inner walls of the passage space and a tolerance between the inner wall of the passage space and the flanges can be compensated for in a simple manner, thus resulting in an improved sealing.

A further embodiment of the device is provided with a spring space which extends in the radial direction between the first flange or the second flange and the wall of the passage space. This spring space can compensate for a difference in expansion between the flanges and the walls of the passage space during heating up or cooling down of the process chamber.

A further embodiment of the device is provided with a discharge duct which is connected to the spring space for discharging a gas.

Via this discharge duct, an off-gas or gas mixture of process gas and purge gas which may possibly leak along the periphery of the transport axle and the first or the second flange, respectively, can be discharged, thus preventing this process gas from entering the space between the process chamber and the housing.

In a further embodiment of the device, a thickness a of the first flange differs from a thickness b of the second flange. By selecting the thickness a of the first flange to be different from the thickness b of the second flange, it is possible, when the device is in operation and the same gap is present between sealing flanges and the transport roller, to adjust the leakage losses between the process chamber and the space between the process chamber and the housing according to:

$$D_{ex}=D_p(1+a/b) \quad (1),$$

in which $D_{ex}$ represents the flow of the gas mixture through the discharge duct, and $D_p$ represents the flow of the process gas which is introduced into the process chamber.

In a further embodiment, the device is provided with a supply which is connected to the space between the process chamber and the housing for introducing a purge gas. The purge gas may provide an inert atmosphere, so that for example the graphite of the process chamber wall does not combust.

In a further embodiment, the device comprises a spring element which is arranged in the passage space for exerting a first force by means of an axially directed side of the first flange on a part of the passage space around the first passage opening and/or a second force by means of an axially directed side of the second flange on a part of the passage space around the second passage opening. This spring element exerts a force in the axial direction by the first and the second flange, respectively, on the side walls of the passage space and an efficient sealing of the passage is achieved.

In a further embodiment, the device is provided with a first adjustable gas stream control unit in the inlet of the process chamber for adjusting a process gas stream and a second adjustable gas stream control unit in a discharge duct of the spring chamber for adjusting an off-gas stream, wherein a desired pressure difference can be set by means of an adjustable process gas stream and an adjustable off-gas stream between a pressure of the process gas in the sealable process chamber in the sealed state and a pressure of a purge gas in the space between the process chamber and the housing. By means of a positive or negative pressure difference, the direction of a leakage gas stream from or to a sealable process chamber in the closed state can be adjusted. In a further embodiment, the device is provided with a first pressure sensor for recording the pressure of a purge gas in the space between the process chamber and the housing, a second pressure sensor in the process chamber for recording the pressure of a process gas and a control unit which is connected to the pressure sensors and the adjustable gas stream control units, wherein the control unit is adapted to maintain the desired pressure difference.

In a further embodiment of the device, the spring element comprises a ring which is fitted between the first and the second flange.

In a further embodiment of the device, opposite sides of the first and the second flange are provided with radially directed ribs, wherein included angles α, which are formed by two adjoining ribs of the first flange and the second flange, respectively, are equal to one another. The number of ribs on the first and the second flange may be, for example, three. By using these three ribs on the first and the second flange, the pressure of the spring ring can be adjusted. In this case, the included angle is 120 degrees.

In a further embodiment of the device, the first flange is positioned with respect to the second flange in such a manner that the ribs of the first flange are rotated with respect to ribs of the second flange through a fixed angle β around the longitudinal axis of the transport roller, which fixed angle β is equal to half the included angle. By positioning the ribs of the first flange in the centre between the ribs of the second flange, the pressure of the spring can be adjusted in an efficient manner. If use is made of the three ribs on the first and second flange, respectively, the fixed angle β around the longitudinal axis of the transport roller on which the first flange is positioned with respect to the second flange is approximately 60 degrees.

In a further embodiment, the ring comprises carbon-containing material, in particular carbon fibre-reinforced carbon. Said carbon fibre-reinforced carbon is a heat-proof material of sufficient strength.

In a further embodiment of the device, the respective first flange and the second flange comprise graphite, borosilicate or fused silica. Graphite, borosilicate and fused silica are heat-proof materials of sufficient stiffness.

In a further embodiment of the device, the outer wall of the first process chamber is provided with a detachable part around the transport roller. By making a part of the outer wall of the first process chamber detachable, the transport roller can be fitted in the first process chamber in a simple manner.

Another embodiment of the device is provided with a vapour transport deposition device which is positioned in front of the at least first process chamber with respect to a direction of transport of the substrate. An advantage of incorporating the vapour transport deposition device in the device for heating the substrate is the fact that the substrate can be transported to the process chamber inside the device immediately after the selenium layer has been applied, as a result of which mass production can be effected in a more efficient way.

Another embodiment of the device is provided with a drive device which is coupled to the transport rollers for rotating the transport rollers. By means thereof, the substrate can be transported into and out of the first process chamber.

In a further embodiment of the device, the drive device is configured to rotate the transport rollers in order to produce an oscillating movement of the substrate in the first process chamber. Due to the oscillating movement of the substrate across the transport rollers, the transfer of heat via the contact between the substrate and the transport rollers is spread across the substrate.

BRIEF DESCRIPTION OF THE DRAWINGS

Although the invention will be described with reference to a number of preferred embodiments, the invention is not limited thereto. The embodiments to be described are merely examples of possible interpretations of the invention and it will be clear to the person skilled in the art that the advantages of the invention can also be achieved in another way.

The invention will be described below with reference to the attached drawings, in which.

DETAILED DESCRIPTION OF THE PREFERRED EMBODIMENTS

Figure 1:
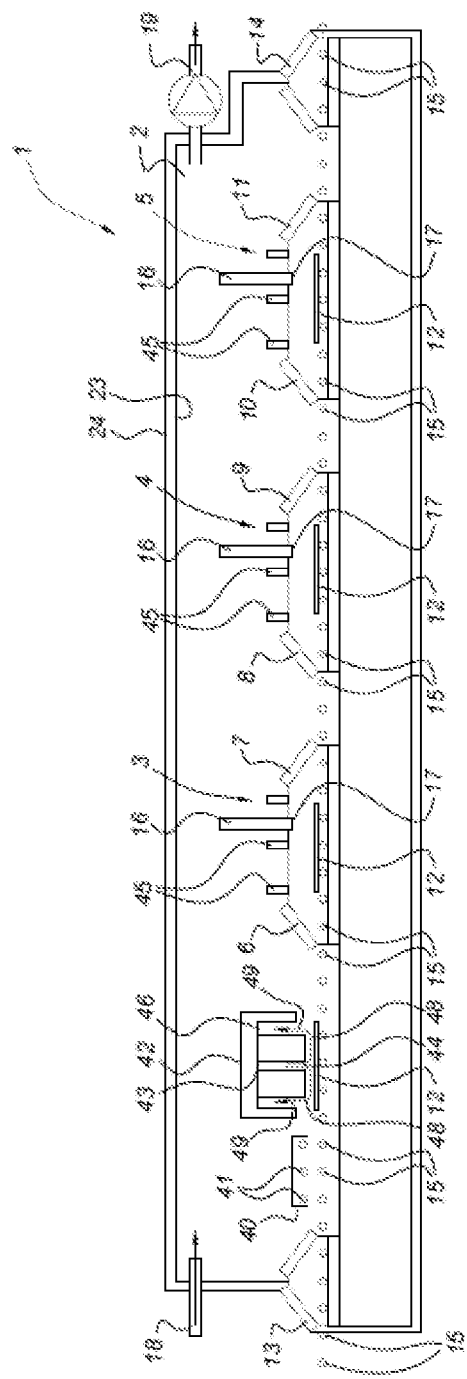
FIG. 1 diagrammatically shows a side view of a device for heating a substrate, FIG. 2 diagrammatically shows a cross section of a detail of the process chamber and a passage for a transport roller, FIG. 3 diagrammatically shows a view of a side of a first flange, FIG. 4 diagrammatically shows a cross section of an assembly of the first flange and the second flange and a spring, FIG. 5 diagrammatically shows a top view of a process chamber, FIG. 6 diagrammatically shows side view of a process chamber, and FIG. 7 diagrammatically shows the device provided with adjustable gas stream control units.

In the figures, identical parts are denoted by the same reference numerals.

FIG. 1 diagrammatically shows a side view of device 1 for heating a substrate according to a predetermined temperature profile for crystallizing a material on the substrate. Such a device 1 is also referred to as a Rapid Thermal Processor (RTP) and is used, for example, for manufacturing a number of photovoltaic solar cells from a substrate. The substrate may contain, for example, glass or borosilicate and have a size of, for example, 60×40 cm, 120×60 cm, or 110×140 cm. The device 1 comprises a housing 2 of layered material, for example a stack of sheet steel, a heat-proof insulating material, for example rock wool, and a graphite layer. The device furthermore comprises a number of, for example three, process chambers 3,4,5 which are all situated inside the housing 2. The process chambers are provided with first 6,8,10 and second 7,9,11 openings, respectively, for the passage of the substrate 12 into the device via the first and the second openings, respectively, of the process chambers. The process chambers 3,4,5 may be made of graphite, borosilicate or fused silica. Furthermore, the device may be provided with an inlet port 13 and an outlet port 14 between which the process chambers 3,4,5 are arranged. The inlet port and the outlet port can be sealed and provided with doors for allowing the substrates 12 in or out. The inlet port and the outlet port may also be made of graphite, borosilicate or fused silica. The process chambers 3,4,5 may furthermore be provided with electric heating elements, for example quartz elements 45 for producing a desired temperature profile in the process chambers. The temperature range within the profile may in this case be set in a range of, for example, 300 to 550° Celsius. The device may furthermore be provided with respective evaporators 16 which are coupled to the respective process chambers via respective inlets 17. The evaporators 16 are designed to melt and evaporate a material which is to be applied to the substrate, for example selenium, and may be provided with electric heating elements for heating the selenium material to above the melting temperature of the selenium. Another example of a material which is to be applied may be, for example, silver (Ag) or sulphur (S).

A process gas which comprises the evaporated material and, for example, nitrogen is then passed to the process chambers 3,4,5 via the respective inlets 17.

The device 1 may furthermore be provided with a preheater 40 for bringing the substrate 12 to a desired first temperature, for example 100° C. The preheater may comprise quartz tubes 41. The device 1 may furthermore be provided with a known vapour transport deposition device 42. The vapour transport deposition device 42 is positioned in front of the at least first process chamber 4 with respect to a transport direction of the substrate 12, for example between the inlet port 14 and the first process chamber 4.

The vapour transport deposition device 42 comprises an evaporator for evaporating the material to be applied, for example selenium, and a connection for the supply of nitrogen gas. The vapour transport deposition device is furthermore provided with an outlet duct 42 with an outflow opening 44, wherein the vapour transport deposition device is configured to supply a nitrogen selenium vapour 48 with a temperature of approximately 500° C. to the upper side of the substrate 12. The width of the outflow opening 44 corresponds to the width of the substrate and is, for example, 60 cm. The length of the outflow opening is, for example, 20 mm. Furthermore, the vapour transport deposition device is provided with two extraction ducts 46 with an extraction opening which faces the substrate for extracting the nitrogen selenium vapour 48 which has not been deposited on the substrate. An advantage of incorporating the vapour transport deposition device in the device is the fact that the substrate can be transported to the process chamber inside the device immediately after the selenium layer has been applied, as a result of which mass production can be effected in a more efficient way. The device 1 may also be provided with a gas inlet 18 to enable a purge gas to flow into the housing, for example an inert gas, such as nitrogen ($N_2$), in order to produce a low-oxygen environment in the space between the housing 2 and the process chambers 3,4,5, thus preventing the graphite material of, for example, the walls of the process chambers 3,4,5 from combusting.

In addition, the device may be provided with a vacuum pump 19 for applying a vacuum inside the housing 2. The pressure inside the device may be set in a range between 0.001 and 1100 mbar absolute.

Due to the temperature profile of the substrate and the controlled vapour pressure of the selenium vapour, the recrystallization can take place at a desired phase transition.

The device may be provided with transport rollers 15 for moving the substrate from the inlet port 13 to the outlet port 14 via the respective first 6,8,10 and second openings 7,9,11 in the successive process chambers 3,4,5. The transport rollers 15 may be made of fused silica and have a length of, for example, 80 cm and a diameter of 100 mm. The construction of the process chambers 3,4 and 5 is identical.

The transport rollers may be rotatably attached to the housing to enable transport of the substrates 12 inside the process chambers 3,4,5.

The dimensions of the process chambers 3,4,5 may be chosen such that several substrates 12 can be processed in a single process chamber 3,4,5.

In order to prevent losses of the process gas comprising the selenium vapour from the process chamber to a space between the process chamber and the housing, the device comprises sealing means. In an embodiment, these sealing means comprise passage spaces 20 which are provided near respective ends of the transport rollers 15 in the walls of the process chambers.

Figure 2:
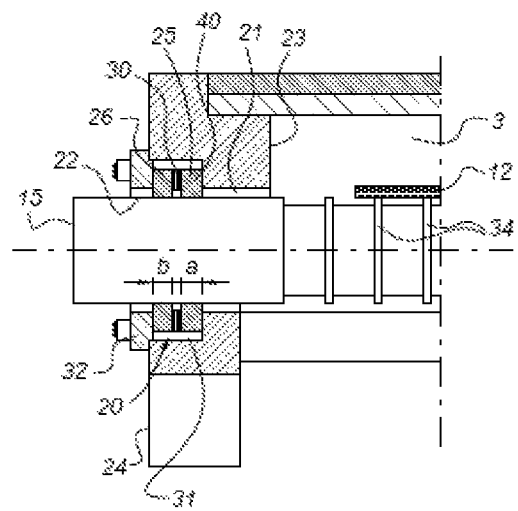

FIG. 2 shows a diagrammatic cross section of a detail of a process chamber with the passage space 20 therein. The passage space 20 may be provided with a first passage opening 21 on an inner wall 23 of the process chamber 3, a second passage opening 22 on an outer wall 24 of the process chamber and a first 25 and a second 26 flange, which are fixed around the transport roller 15 to prevent loss of material in the vapour phase via the passage space. The second flange 26 may be fixed around the transport roller next to the first flange 25, with the first flange 25 being situated near the first passage opening 21 and the second flange 26 being situated near the second passage opening 22. The first and the second flanges 25,26 may be made of graphite, borosilicate or fused silica.

Figure 3:
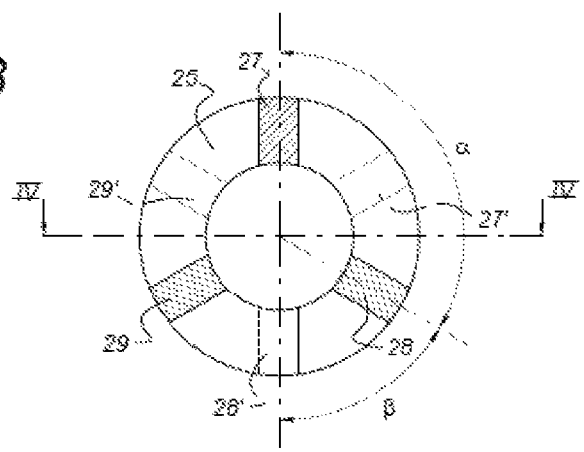

In addition, the opposite sides of the first and the second flange may be provided with, for example three, radially directed ribs. FIG. 3 shows a view of a side of the first flange 25, and the three ribs 27,28,29 provided thereon. Furthermore, FIG. 3 shows the projection of the three ribs 27',28', 29' of the second flange 26 on the first flange, in which case included angles α formed by two adjoining ribs of the first flange and the second flange, respectively, are equal to one another and the first flange can be positioned in such a manner with respect to the second flange that the three ribs of the first flange are rotated through a fixed angle β with respect to the three ribs of the second flange about the longitudinal axis of the transport roller, which fixed angle is equal to half the included angle. In the case of 3 ribs per flange, this fixed angle is 60 degrees.

FIG. 3 shows a view of a side of a flange 25, and the three ribs 27,28,29 provided thereon. Furthermore, FIG. 3 shows the projection of the three ribs 27',28',29' of the second flange 26 on the first flange.

The passage space may furthermore comprise an annular spring element 30 which is fitted in a spring space 31 between the first and the second flange 25,26 to enable a first force to be exerted by an axially directed side of the first flange 25 on a part of the passage space around the first passage opening 21 and a second force to be exerted by an axially directed side of the second flange 26 on a part of the passage space around the second passage opening. The spring space 31 extends in the radial direction between the first flange and the second flange 25,26 and the wall of the process chamber. The annular element 30 may be made of carbon fibre-reinforced carbon. In an embodiment, the spring element may be incorporated in the first flange 25 and the second flange 26.

Figure 4:
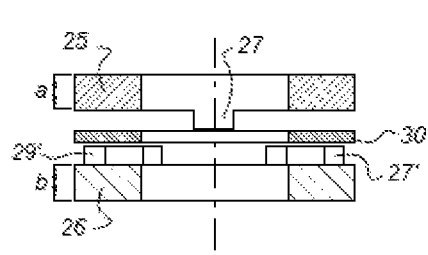

FIG. 4 shows a cross section of an assembly of the first and the second flange 25,26 with the ring 30 running through the ribs 28,29 of the first flange 25 and the rib 28' of the second flange 26. As the ring 30 is clamped by the successive ribs 27,28,29 of the first and the successive ribs 27', 28',29', respectively, of the second flange, the ring 30 can be placed under prestress so that the first force can be exerted by an axially directed side of the first flange 25 on a part of the passage space around the first passage opening and the second force can be exerted by an axially directed side of the second flange on a part of the passage space around the second passage opening. This results in a sealing of the passage which prevents leakage of the evaporated material through the passage.

If necessary, several rings 30 may be fitted in order to increase the prestress.

The spring space 31 extends in the radial direction between the first and the second flange 25,26 and between the edge of the flanges 25,26 and the wall of the passage space 20 in order to compensate for differences in expansion between the material of the flanges 25,26 and the material of the walls of the process chamber resulting from the heating up or cooling down of the device.

The process chamber 3 may furthermore be provided with a discharge duct 50 which is connected to the spring space 31 for the discharge of off-gas, for example a mixture of the process gas comprising selenium vapour and $N_2$, which may possibly leak through a first gap between the first flange 25 and the transport axle 15 of the passage space 20 and a purge gas or inert gas which possibly leaks through a second gap between the second flange 26 and the transport axle 15. The discharge ducts 50 of the spring chambers 31 may be connected to one another and be connected to a vacuum pump (not shown). The thickness a of the first flange 25 and the thickness b of the second flange may be equal to one another or may be chosen to be different from one another. By choosing a fixed ratio between the thicknesses a and b and adjusting the flow through the discharge duct 50 with respect to a process gas stream through the inlet 17, it is possible to set a pressure difference between the process space in a closed process chamber 3 and the pressure of the purge gas in the space between the process chamber and the housing 2. This is explained with reference to FIG. 7.

FIG. 7 diagrammatically shows an embodiment of a device 1 with a process chamber 3 which is described with reference to FIG. 1 and FIG. 2, wherein the device is furthermore provided with a first adjustable gas stream control unit 51 in the inlet 17 of the process chamber 3 for adjusting the process gas stream and a second gas stream control unit 52 in the discharge duct 50 for adjusting an off-gas stream from the spring chamber 31. The adjustable gas stream control units 51,52 are configured to allow a desired flow $D_p$, $D_{ex}$ of the process gas stream and the off-gas stream, respectively, to flow through. As a result of the adjustable process gas stream and the adjustable off-gas stream, a desired pressure difference can be set between a pressure of the process gas in the sealable process chamber 3 in the sealed state and a pressure of a purge gas in the space between the process chamber 3 and the housing 2.

In an embodiment, the device may furthermore be provided with a first pressure sensor 53 for recording the pressure $P_f$ of the purge gas in the space between the process chambers 3,4,5 and the housing 2, a second pressure sensor 54 in the process chamber 3 for recording the pressure $P_p$ of the process gas and a control unit 55 which is connected to the pressure sensors 53,54 and the gas stream control units 51,52. The control unit 55 is furthermore configured to maintain an adjustable pressure difference $P_f$ and $P_p$ at a desired process gas stream. In addition, FIG. 7 shows the transport axle 15 which is rotatably connected to the housing 2 by the passage spaces 20. The passage spaces 20 are provided with the first and the second flanges 25,26. Furthermore, the spring space 31 extends in the radial direction between the flanges 25,26 and the wall of the passage space 20. The spring space is furthermore in open communication with the transport axle 15 and the wall of the passage space 20. The spring space 31 is connected to a vacuum pump (not shown) via the discharge duct 50. In a situation with a closed process chamber, a pressure $P_p$ of the process gas which equals a pressure $P_f$ of the purge gas inside the space between the closed process chamber 3 and the housing 2, and an identical gap between the first flange and the second flange 25,26 and the transport axle 15, respectively, the flow of the off-gas stream which is discharged via the discharge duct, is determined by:

$$D_{ex}=D_p(1+a/b) \quad (1),$$

in which $D_{ex}$ represents the flow of the off-gas stream which is discharged via the discharge duct, and
$D_p$ represents the flow of the process gas which is introduced into the process chamber,
a represents the thickness of the first flange, and
b represents the thickness of the second flange.

In an embodiment, it is possible to achieve an overpressure or an underpressure compared to the pressure of the purge gas in the space between the process chamber 3 and the housing 2 by setting a size for the flow $D_{ex}$ of the off-gas stream through the discharge duct 50 in the process chamber, which makes it possible to direct a leakage gas stream into the process chamber or out of the process chamber, depending on a desired process.

In order to enable fitting of the transport rollers 15 in the process chamber 3, the outer wall 24 of the passage space can be provided with a detachable part 32 around the transport roller 15. The transport rollers 15 may furthermore be provided with radially directed ribs 34 for reducing the thermal conduction between the substrate 3 and the transport rollers 15 in order to obtain a more uniform temperature distribution on the substrate. In an embodiment the sealing means comprise process chamber doors for sealing the first and the second openings, respectively, of the process chamber so that selenium vapour is prevented from leaking from the process chamber.

Figure 5:
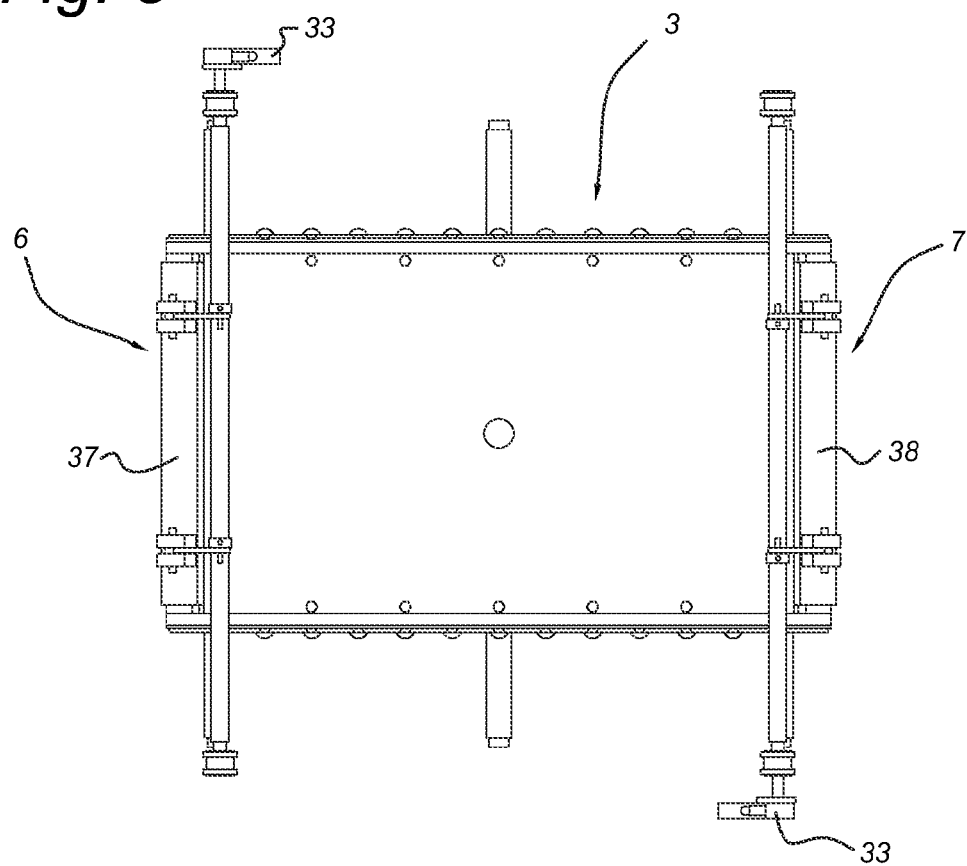

FIG. 5 shows a top view of a process chamber 3, wherein the process chamber is provided with a first process chamber door 37 for sealing the first opening 6 of the process chamber 3 and a second process chamber door 38 for sealing the second opening 7 of the first process chamber 3 and actuators 33 for opening and closing the respective process chamber doors. The process chamber doors 37,38 can also be made of graphite, borosilicate or fused silica.

Figure 6:
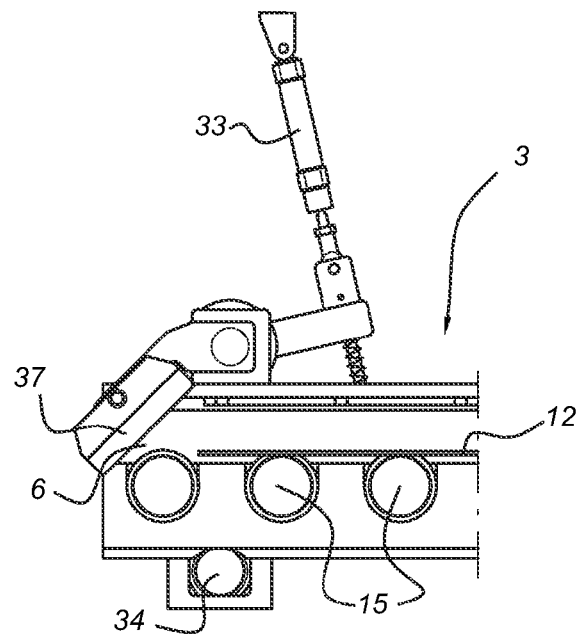

FIG. 6 shows a side view of a process chamber 3 with the process chamber door 37 and the opening 6 of the process chamber 3. Furthermore, FIG. 6 shows the actuator 33 for opening and closing the process chamber door 37. In addition, the device can be provided with a control device which is electrically coupled to the actuators for actuating the actuators, in which the control device is configured to open and close the first and the second openings of the process chambers for the passage of the substrate from a first to a second process chamber.

The device 1 may furthermore be provided with a drive device 34 which is coupled to the transport rollers 15 for rotating the transport rollers for transporting the substrate 12. Furthermore, FIG. 6 shows the substrate 12, the transport rollers 15 and the drive device 34. The drive device 34 may be configured for transporting substrate from the inlet port 13 to the outlet port 14, via the process chambers 3,4,6. In this case, the maximum transport speed is in the range from 50 to 800 mm/s.

The drive device 34 may furthermore be configured to cause the substrate 12 to carry out an oscillating movement or a horizontal to-and-fro movement inside process chambers 3,4,5. The maximum horizontal movement of the substrate 12 is in the range between 5 and 200 mm. The period of this oscillating movement is in the range from 10 to 20 seconds. This results in a more uniform temperature distribution on the substrate 12, thus preventing the substrate 12 from sagging.

The present invention is not limited to the preferred embodiments thereof which are described above. Rather, the rights sought are defined by the following claims, which allow for numerous modifications.

The invention claimed is:

1. A device for heating a substrate according to a predetermined temperature profile for crystallizing a material on the substrate, the device comprising:
   a housing;
   at least one process chamber which is situated inside the housing and which is provided with
      a first sealable opening and a second sealable opening for passing a substrate therethrough,
      an inlet configured to introduce a process gas into the process chamber,
      at least two transport rollers configured to transport the substrate into the process chamber, the transport rollers being attached to the housing to be rotatable, and
      a sealing system configured to prevent escape of the process gas from the process chamber to a space between the process chamber and the housing, the sealing system comprising
         passage spaces situated near respective ends of the transport rollers in the process chamber, each of the passage spaces being provided with
            a first passage opening on an inner wall of the process chamber,
            a second passage opening on an outer wall of the process chamber,
            a first flange which is disposed around the transport roller,
            a second flange which is disposed around the transport roller next to the first flange, and
            a spring space which extends in a radial direction between the first flange or the second flange and a side of the passage space, and
         detachable parts attached at an outer wall of the process chamber,
         opposite faces of the first and second flanges being provided with radially-directed ribs, the ribs of the first flange having an offset angle with respect to the ribs of the second flange;
   at least one quartz element provided adjacent the process chamber and controlled by a controller to heat the process chamber in order to heat the substrate as the substrate passes through the process chamber by producing a predetermined temperature profile within the process chamber; and
   a spring element comprising a ring disposed in the spring space between the ribs of the first flange and the ribs of the second flange such that a force is exerted in the axial direction by the first flange and the second flange on the side walls of the passage space that are disposed adjacent the first passage opening to effectively seal the passage space,
   wherein the first and second flanges are positioned so that the transport roller is capable of moving in the axial direction and rotating inside the first and second flanges, the first and second flanges being configured to move radially over a part of the passage space around the transport roller.

2. The device according to claim 1, further comprising a discharge duct which is connected to the spring space to discharge a gas from the spring space.

3. The device according to claim 1, wherein a thickness a of the first flange differs from a thickness b of the second flange.

4. The device according to claim 1, further comprising a supply device which is connected to a space between the process chamber and the housing to introduce a purge gas.

5. The device according to claim 2, further comprising:
   a first adjustable gas stream control unit in the inlet of the process chamber, the first adjustable gas stream control unit being configured to adjust a process gas stream, and
   a second gas stream control unit in a discharge duct of the spring space, the second gas stream control unit being configured to adjust an off-gas stream from the spring space,
   wherein a desired pressure difference is set by the adjustable process gas stream and the adjustable off-gas stream between a pressure of the process gas in the sealable process chamber in the sealed state and a pressure of a purge gas in the space between the process chamber and the housing.

6. The device according to claim 5, further comprising:
   a first pressure sensor configured to record the pressure of the purge gas in the space between the process chamber and the housing,
   a second pressure sensor in the process chamber, the second pressure sensor being configured to record the pressure of the process gas, and
   a control unit which is connected to the first and second pressure sensors and the adjustable gas stream control units, wherein the control unit being configured to maintain the desired pressure difference.

7. The device according to claim 1, wherein included angles α formed by two adjoining ribs of the first flange and the second flange, respectively, are equal to one another.

8. The device according to claim 7, wherein the first flange is positioned with respect to the second flange such that the ribs of the first flange are rotated with respect to the ribs of the second flange through a fixed angle β around the longitudinal axis of the transport roller, the fixed angle being equal to half the included angle α.

9. The device according to claim 1, wherein the ring comprises carbon-containing material.

10. The device according to claim 1, wherein the respective first flange and the second flange comprise graphite, fused silica, or borosilicate.

11. The device according to claim 1, wherein the outer side of the passage space is provided with a detachable part around the transport rollers.

12. The device according to claim 1, further comprising a vapor transport deposition device which is positioned in front of the at least one process chamber with respect to a direction of transport of the substrate.

13. The device according to claim 1, further comprising a drive device which is coupled to the transport rollers and is configured to rotate the transport rollers.

14. The device according to claim 13, wherein the drive device is configured to rotate the transport rollers in order to produce an oscillating movement of the substrate in the process chamber.

15. The device according to claim 9, wherein the spring element comprises carbon fiber-reinforced carbon.

* * * * *